US009048828B2

(12) United States Patent
Horvat et al.

(10) Patent No.: US 9,048,828 B2
(45) Date of Patent: Jun. 2, 2015

(54) CONTROLLER FOR A TRANSDUCER, TRANSDUCER, AND CONTROL METHOD

(71) Applicant: MAGNA Powertrain AG & Co KG, Lannach (AT)

(72) Inventors: Janko Horvat, Wagna (AT); Stefan Laimgruber, Graz (AT)

(73) Assignee: Magna Pawertrain AG & Co KG, Lannach (AT)

( * ) Notice: Subject to any disclaimer, the term of this patent is extended or adjusted under 35 U.S.C. 154(b) by 0 days.

(21) Appl. No.: 14/364,854

(22) PCT Filed: Nov. 27, 2012

(86) PCT No.: PCT/EP2012/073725
§ 371 (c)(1),
(2) Date: Jun. 12, 2014

(87) PCT Pub. No.: WO2013/092130
PCT Pub. Date: Jun. 27, 2013

(65) Prior Publication Data
US 2014/0375375 A1 Dec. 25, 2014

(30) Foreign Application Priority Data

Dec. 22, 2011 (DE) ...................... 10 2011 056 941 U

(51) Int. Cl.
H03K 17/04 (2006.01)
H03K 17/042 (2006.01)
H02M 3/157 (2006.01)
H02M 3/158 (2006.01)
H02M 3/335 (2006.01)

(52) U.S. Cl.
CPC ............. *H03K 17/042* (2013.01); *H02M 3/157* (2013.01); *H02M 3/158* (2013.01); *H02M 3/33515* (2013.01)

(58) Field of Classification Search
CPC .... G11C 27/02; G11C 27/024; G11C 27/026; G11C 27/028; H03M 1/1245
See application file for complete search history.

(56) References Cited

U.S. PATENT DOCUMENTS

| 6,384,690 | B1 * | 5/2002 | Wilhelmsson et al. | 331/11 |
| 8,193,853 | B2 * | 6/2012 | Hsieh et al. | 327/536 |
| 2009/0244939 | A1 * | 10/2009 | Fornage | 363/58 |
| 2011/0121757 | A1 | 5/2011 | Welten | |

FOREIGN PATENT DOCUMENTS

DE 102009027307 A1 4/2010
EP 2388902 A1 11/2011

OTHER PUBLICATIONS

Hyun Choi; Gomes, A.B.; Chatterjee, A.: Signal Acquisition of High-Speed Periodic Signals Using Incoherent Sub-Sampling and Back-End Signal Reconstruction Algorithms. In: Very Large Scale Integration (VLSI) Systems, IEEE Transactions on, vol. 19, Issue: 7, 2011, 1125-1135.

* cited by examiner

*Primary Examiner* — Sibin Chen
(74) *Attorney, Agent, or Firm* — Dickinson Wright PLLC

(57) ABSTRACT

A controller for a converter is designed to receive from a measuring device measurement signals from an output line of the converter, and to analyze the measurement signals in order to generate a switching signal that has a switching frequency, wherein the controller comprises a sampler for generating a sample signal by sampling received measurement signals. The sampler is designed to perform the sampling at a sampling frequency that is less than three times the switching frequency. A converter comprises a controller in accordance with the invention.

20 Claims, 5 Drawing Sheets

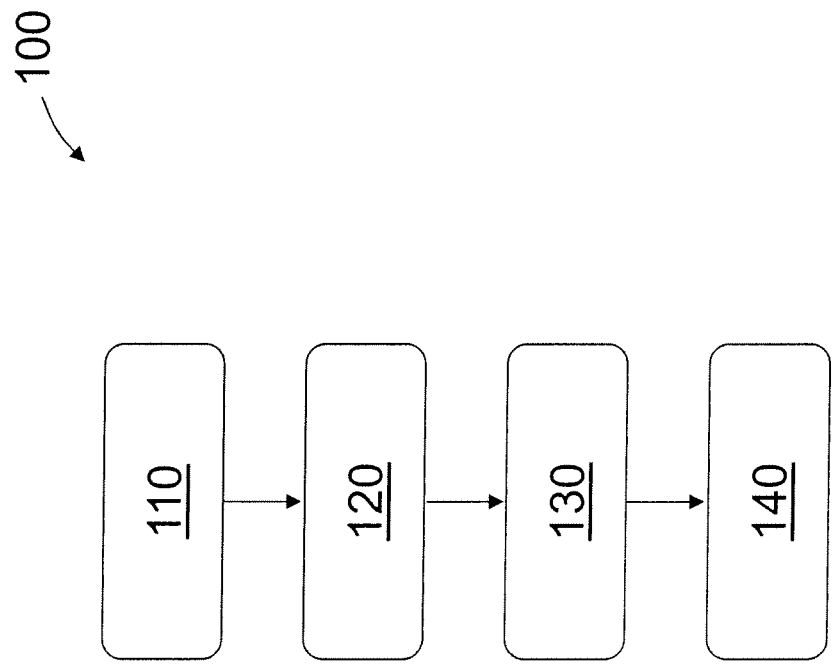

CONTROLLER FOR A TRANSDUCER, TRANSDUCER, AND CONTROL METHOD

This application is a National Stage of International Application No. PCT/EP2012/073725 filed Nov. 27, 2012 which claims the benefit and priority of German Application No. DE102011056941.3 filed Dec. 22, 2011 which are all hereby incorporated by reference.

TECHNICAL FIELD

The invention relates to a controller for a converter, wherein the controller is designed to receive from a measuring device measurement signals on an output line of the converter, and to analyze the measurement signals in order to generate a switching signal that has a switching frequency, wherein the controller comprises a sampler for generating a sample signal by sampling received measurement signals. If the converter is a multiphase converter, the output line is typically a phase line, the output current of which contributes to a total load current that is obtained by summating the currents of a plurality of phase lines. The switching frequency is typically a fundamental frequency (preferably the lowest fundamental frequency) of the switching cycle of the switches of the converter.

In addition, the invention relates to a converter comprising a controller designed to receive measurement signals from a measuring device on an output line of the converter and to analyze the measurement signals in order to generate a switching signal that has a switching frequency, wherein the controller includes a sampler for generating a sample signal by sampling measurement signals, and wherein the sampler is designed to perform the sampling at a sampling frequency that is less than three times the switching frequency.

The invention also relates to a control method for operating a converter, wherein the control method comprises the following steps: generating measurement signals on the basis of an electrical status of an output line; generating a sample signal by sampling the received measurement signals at a sampling frequency; analyzing the sample signal; and generating a switching signal at a switching frequency.

BACKGROUND

DE 10 2009 027 307 A1 describes a multiphase DC/DC converter. Each phase has a dedicated current sensor that supplies current values to a converter control element. The current control element generates on the basis of a reference current and received current values, gate driver signals for switching the phases. In an alternative arrangement, only one current sensor is provided, which measures the total load current and hence generates a current information signal for the load current that is obtained from the summated load current of a multiplicity of phases.

SUMMARY

The object of the present invention is to provide a controller for a converter that can be produced more cheaply than known controllers. It is also an object of the invention to provide a converter and a control method that can be operated using a controller that can be produced cheaply.

This object is achieved by the independent claims. The subject matter of the subclaims contains advantageous developments of the inventive idea.

The invention develops the controller by designing the sample to perform the sampling at a sampling frequency that is less than three times the switching frequency. As a result, for the subsequent signal analysis, a typical period is composed of measurement values from a plurality of (contiguous or non-contiguous) periods. By virtue of the subsampling, the upper frequency limit and bandwidth of the signal to be analyzed after sampling are lower than in the known controller. The subsampling and smaller bandwidth result in lower speed requirements for analyzing the sampled signals, and the controller is cheaper to produce. The sampling frequency can be a mean sampling frequency. It can be defined as the inverse of a mean value of the time intervals between successive time-contiguous trigger signals for opening the gate of the sampler for the purpose of defining points in time for taking measurements of the measurement signal.

The sampler can be designed to perform the sampling, for a switching frequency, at a mean sampling frequency, where neither the quotient of the mean sampling frequency divided by the switching frequency is a whole number nor the quotient of the switching frequency divided by the mean sampling frequency is a whole number. Satisfying this condition means that a plurality of interpolation points are captured by sampling a plurality of periods of a periodic signal waveform, and the high frequency signal, having a time scale equal to the ratio of the switching frequency to the difference between switching frequency and sampling frequency, can thereby be mapped onto a low frequency signal. If the sampling frequency is higher than the switching frequency, the difference, and hence the time scale, is negative. This means that the mapping of the high frequency signal then appears as a mirror image in the time domain. The mirror image in the time domain can be reversed again by swapping over interpolation values during the analysis of the low frequency signal.

The switching-signal generator can be designed to generate the switching signal at a switching frequency that is greater than the sampling frequency at least by the factor n, where n equals 5/6, 21/20, 11/10, 6/5, 2, 4, 8, 16, 32, 64 or another power of two. The choice of the factor n determines the speed and accuracy at which the original signal can be reproduced. The factor also determines the required performance of the controller. It should be mentioned to aid understanding that a sampling frequency that is more than twice as high as the switching frequency is generally still far from satisfying the Nyquist criterion. This is because the load signal usually contains not only the fundamental frequency of the switching process but significantly higher frequency components, the information content of which is meant to be retained until the subsequent analysis. This information can be used, for instance, to detect in the signal to be analyzed, relative lengths of the edges and the dead time, and to analyze same.

The sampler can be designed to perform the sampling using successive trigger signals, wherein a density function for time intervals between successive time-contiguous trigger signals comprises one or more Dirac delta functions and/or a continuous density function. A noise spectrum of the controller can be improved by sampling using different time intervals between time-contiguous trigger signals (gate signals).

The controller can be designed to determine from the sample signal at least one first type of statistical values. By reducing the measurement data to a few informative, aggregate values, subsequent analysis steps and generating the switching signal can be implemented more clearly and cheaply.

The at least one first type of statistical values can include maximum values, minimum values, effective values, arithmetic mean values and/or median values.

The controller can comprise at least one first comparator in order to compare a first setpoint value with a first actual value, which can be determined from the sample signal, and to determine from the result of the comparison a first correcting variable. For example, the first setpoint value and the first actual value may be an output current, an output voltage or a spectral characteristic of one or more of these variables.

The controller can comprise at least one second comparator in order to compare a second setpoint value with a second actual value, which can be determined from the sample signal, and to determine from the result of the comparison a second correcting variable. The second setpoint value and the second actual value can again be, for instance, an output current, an output voltage or a spectral characteristic of these variables.

The sample signals can be analyzed with regard to an output current, an output voltage and/or a spectral characteristic of one or more of these variables on the output line.

The controller can be designed to control a minimum output current for a falling edge of an output current. The output current is typically the current on an output line of a phase.

The controller can be designed to control a peak current, an effective current, a mean current or another characteristic of the output current for a rising edge of an output current. Again in this case, the output current is typically the current on an output line of a phase.

The controller can be designed to receive measurement signals from at least two phase-specific output lines, to sample the received measurement signals, to generate the sample signals, and to generate the switching signals. The controller can thereby be used simultaneously for two or more phases. In addition, cross-phase coordination between the phases is possible within the controller, for example for coordinated execution of a start-up cycle, for coordinated shutdown in the event of a fault or for load or current distribution in normal operation.

The converter of the present invention is developed by comprising at least one controller in accordance with the invention. The above-mentioned advantage can thereby be used for the converter.

The converter can comprise a load-current distributor for distributing a load current to a plurality of phases. A maximum power rating for the switching paths of individual phases can hence be fully utilized (with the inclusion of a safety margin), thereby avoiding costly overdesign of the switching paths of individual phases.

The control method of the present invention for operating a converter is developed by the switching frequency being three times higher than the sampling frequency. The resulting advantages have been described in the introduction.

DRAWINGS

The invention is explained in greater detail below with reference to exemplary embodiments illustrated in the schematic drawings, in which:

FIG. 5 illustrates a flow diagram of an embodiment of a control method for operating a converter.

The same reference signs are used for corresponding components in each of the figures. Explanations that refer to reference signs therefore apply to all the figures unless the context dictates otherwise.

DESCRIPTION

Figure 1:
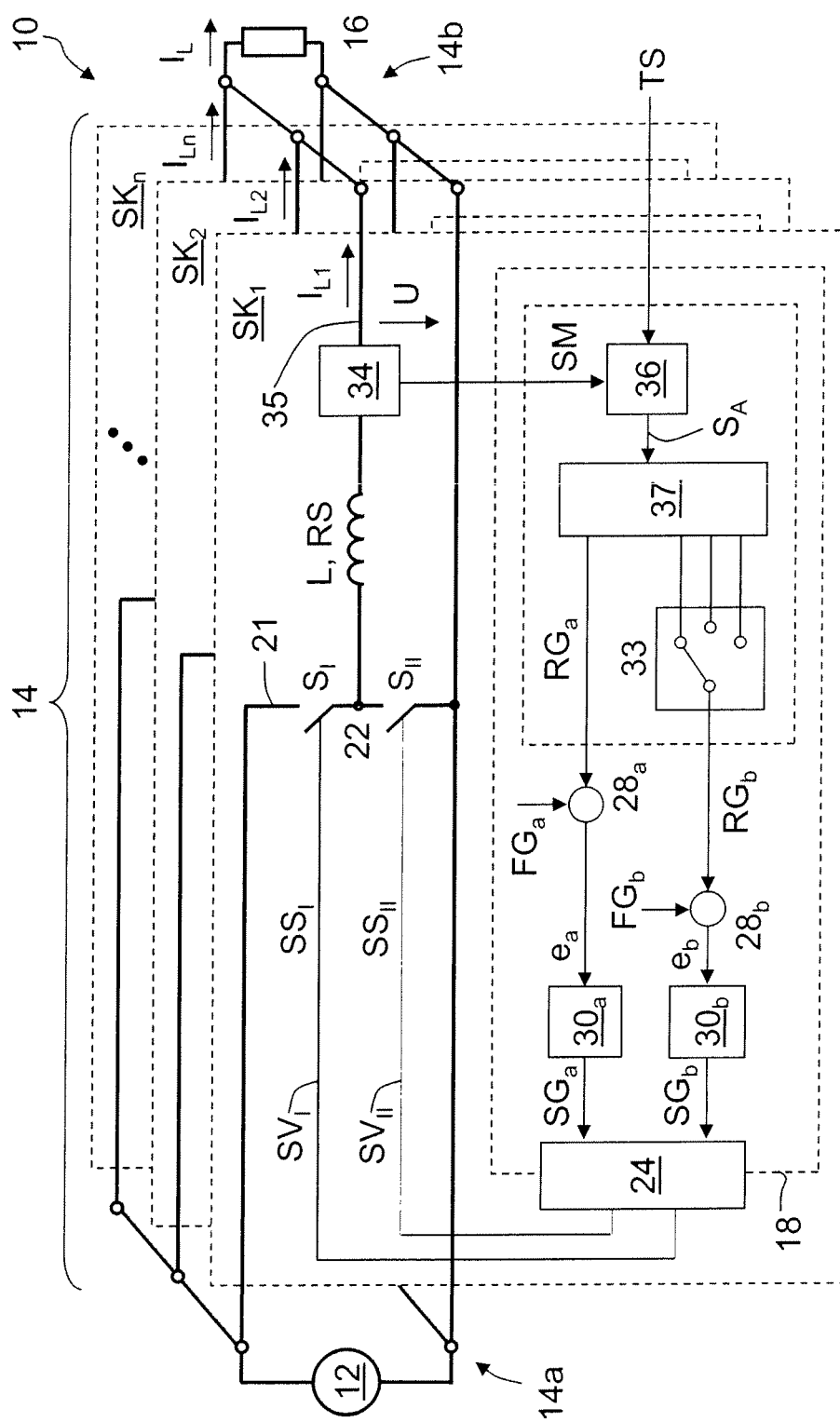
FIG. 1 illustrates a block diagram of a circuit having an electrical power source, an embodiment of a converter and an electrical load.

FIG. 1 illustrates a circuit arrangement 10 having a voltage source 12 as an electrical power source, a converter 14 and an electrical load 16. The converter can be a single-phase or multiphase converter, can be galvanically isolated or not galvanically isolated, unidirectional or bidirectional. The electrical power source 12 can be a DC voltage source, an AC voltage source, a DC current source or an AC current source. The electrical load 16 can comprise reactive components in addition to resistive components. The converter 14 comprises for a first phase a first switch $S_I$, a second switch $S_{II}$, an inductance L and a converter controller 18. Both switches $S_I$, $S_{II}$, are single-pole switches. The first switch $S_I$ is typically a semiconductor switch, for example a MOSFET or an IGBT (insulated gate bipolar transistor). The second switch $S_{II}$ is typically the same type of semiconductor or is a flyback diode. A first terminal 21 of the first switch $S_I$ is connected to the voltage source 12, and a second terminal 22 of the first switch S, is connected to the inductance L. It is indicated in the figure that the converter 14 can comprise a plurality of circuits $SK_I \ldots SK_n$ of identical design for one or more further phases between converter input 14a and converter output 14b. These circuits then typically operate using switching cycles D, F, B in intermittent mode and D, F in non-intermittent mode (see FIG. 2a), which cycles have a different time offset from one another. Unless stated otherwise, the following description explains the converter controller 18 for the first phase. The concepts described can be applied to further phases.

A switching-signal generator 24 (modulator) generates a first switching signals SS, for actuating the first switch $S_I$. The first switching signals SS, are transmitted via a first control connection $SV_I$ to the first switch $S_I$. In the exemplary embodiment shown, the switching-signal generator 24 also generates second switching signals $SS_{II}$ for actuating the second switch $S_{II}$. The second switching signals $SS_{II}$ are transmitted via a second control connection $SV_{II}$ to the second switch $S_{II}$. The converter 14 can alternately adopt the following three operating states D, F, B: a conducting state D, a flyback state F and a standby state B.

In the standby state B, the switching-signal generator 24 controls the two switches $S_I$, $S_{II}$, such that the flow of the output current $I_L$ is stopped. In the conducting state D, the switching-signal generator 24 controls the switches $S_I$, $S_{II}$ such that an output current $I_L$ can flow through the first switch $S_I$ but is stopped for the second switch $S_{II}$. In the flyback state F, the switching-signal generator 24 controls the switches $S_I$, $S_{II}$ such that an output current $I_L$ can flow through the second switch $S_{II}$ but is stopped for the first switch $S_I$. During operation under partial load, the three operating states D, F, B alternate cyclically in the following sequence: conducting state D, flyback state F, standby state B. When the amount of power transferred between the electrical power source 12 and electrical load 16 is low, the conducting state D, i.e. the proportion of time of the conducting state D compared with the switching period, is small. As the amount of power transferred between converter input 14a and converter output 14b increases, the proportion of time of the conducting state D compared with the switching period increases. A person skilled in the art knows numerous possible embodiments for converter switching patterns that can also be used here. These switching patterns are not explained below because these details are not essential to the invention.

The converter controller 18 is part of an open-loop control circuit, which comprises at least one first control loop comprising the following components: a controlled system RS, a first comparator $28_a$ for comparing a first reference value $FG_a$ with a first controlled variable $RG_a$, a first closed-loop controller $30_a$ and a final control element 24, $S_I$, $S_{II}$. In the exemplary embodiment illustrated in the figure, the controlled system RS is formed by the power source, the input filter (not illustrated), the switches, inductance L, output filter (not illustrated) and the load. The final control element 24, $S_I$, $S_{II}$ is formed jointly by the switching-signal generator 24 and the two switches $S_I$, $S_{II}$. The proportion of time of the flyback state F compared with the total period of the switching cycle D, F, B acts as the first correcting variable $SG_a$. The minimum $\min(I_L)$ of the output current $I_L$ output by the converter 14 to the electrical load 16 acts as the first controlled variable $RG_a$. The first controlled variable $RG_a$ is obtained by means of a phase-specific current sensor 34 for detecting an intensity of an output current $I_{L1}$ on an output line 35 of a phase of the converter 14, and by means of a sampler 36 and a subsequent current-signal analyzer 37. The sampler 36 and the signal analyzer 37 are components of the converter controller 18. The first comparator $28_a$ determines a first error signal $e_a$ by means of a first comparison of the first reference value $FG_a$ with the first controlled variable $RG_a$. The first closed-loop controller $30_a$ (for example a PID controller) determines the first correcting variable $SG_a$ from the temporal waveform of the first error signal $e_a$.

The exemplary embodiment illustrates a second control loop, which comprises some of the same components 24, 34, 36, 37, L, $S_I$, $S_{II}$ as the first control loop. The second control loop includes the following components: the controlled system RS, a second comparator $28_b$ for a comparison between a second reference value $FG_b$ and a second controlled variable $RG_b$, a second closed-loop controller $30_6$ and the final control element 24, $S_I$, $S_{II}$. The inductance L again forms the controlled system RS. As in the first control loop, the final control element 24, $S_I$, $S_{II}$ is formed jointly by the switching-signal generator 24 and the two switches $S_I$, $S_{II}$. In the second control loop, the proportion of time of the conducting state D compared with the total period of the switching cycle D, F, B acts as the second correcting variable $SG_b$. A second characteristic value of the power transfer by the converter 14 acts as a second controlled variable $RG_b$. This can be, for example, a maximum, a mean or an effective value of the output current $I_L$ output by the converter 14 to the electrical load 16. In the exemplary embodiment, the second controlled variable $RG_b$ is obtained using the same current sensor 34, the same sampler 36 and the same signal analyzer 37 as the first controlled variable $RG_a$. A selector switch 33 can be used to select the second controlled variable $RG_b$ from a plurality of alternatives (for example types of mean values). The second comparator $28_b$ determines a second error signal $e_b$ by means of a second comparison of the second reference value $FG_b$ with the second controlled variable $RG_b$. The second closed-loop controller $30_b$ (for example also a PID controller) determines the second correcting variable $SG_b$ from a temporal waveform of the second error signal $e_b$. Only the peak current is controlled directly by the rising edge. All the other calculated values (such as effective values, mean values) are based on the complete signal, but can also be set with the rising edge.

Figure 2:
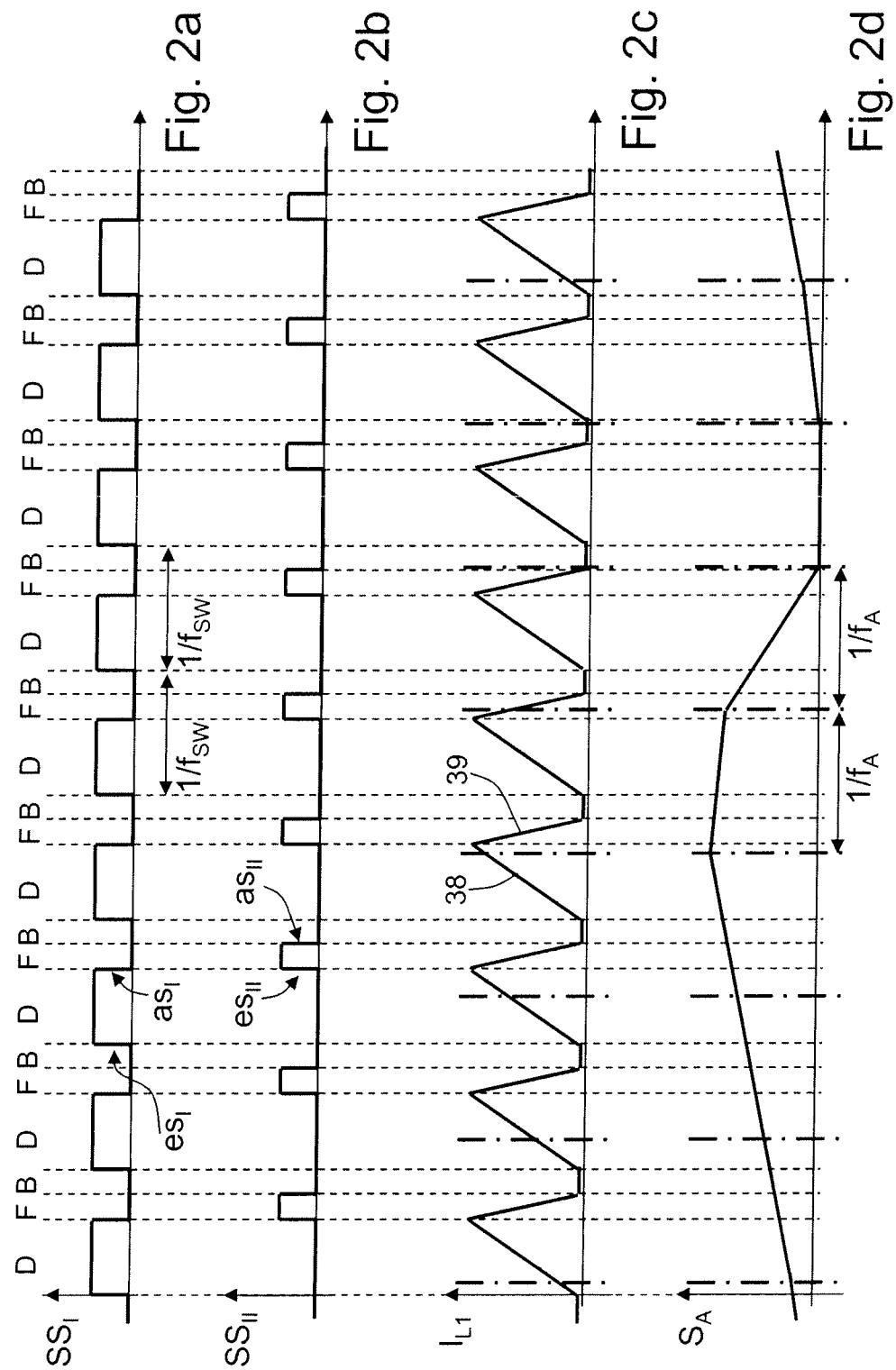
FIG. 2 illustrates a timing diagram comprising an example of switching signals from the converter controller, an example of a waveform of the output current from the converter, and an example of a waveform of the current measurement signal after sampling.

FIG. 2a illustrates an example of a temporal waveform of the first switching signal $SS_I$ for switching on $es_I$ and switching off $as_{II}$ the first switch $S_I$ of the converter 14 during the conducting state D, during the flyback state F and during the standby state B. The boundaries of the time periods of the operating states D, F, B are illustrated in FIGS. 2a to 2d by dashed lines. FIG. 2b illustrates an example of an associated temporal waveform of the second switching signal $SS_{II}$ for switching on $es_{II}$ and switching off $as_{II}$ the second switch $S_{II}$ of the converter 14. FIG. 2c illustrates an example of an associated temporal waveform of the output current $I_L$, of a phase of the converter 14. In the conducting state D, the intensity of the current $I_L$ through the output line 35 rises. Hence during the conducting state D, a rising edge 38 develops in the temporal waveform of the output current $I_L$. In the flyback state F, the current $I_L$ through the output line 35 falls. Hence during the conducting state, a falling edge 39 develops in the temporal waveform of the output current $I_L$. FIG. 2d illustrates an example of an associated temporal waveform of a sample signal $S_{SAMPLE}$ after sampling 120 by means of the sampler 36. The dash-dotted lines in FIGS. 2c and 2d illustrate an example of a pattern for sampling the output current $I_L$ by the sampler 36. In the example illustrated in FIGS. 2c and 2d, sampling 120 of the output current $I_L$ is performed almost once every switching period, wherein the sampling 120 in the immediately following switching period in each case (relative to the start thereof) is performed slightly later than in the immediately preceding switching period (relative to the start thereof). The sampling cycle is asynchronous with the switching periods of the switching signals $SS_I$, $SS_{II}$. As a result of the slippage between the sampling cycle and the switching signals $SS_I$, $SS_{II}$, the sampling 120 maps the temporal waveform of the intensity of the output current $I_{L1}$ of a phase into a sample signal $S_{SAMPLE}$ having a similar waveform but longer time scale, i.e. lower frequency $f_{SAMPLE}$. In an alternative (not illustrated explicitly in the fig.), the second correcting variable $SG_b$ can be a preset reference value (instead of being provided by the second closed-loop controller $30_b$).

In a further preferred alternative, the second correcting variable $SG_b$ can be provided by a voltage regulator 40 or by a load-current distributor 42.

Figure 3:
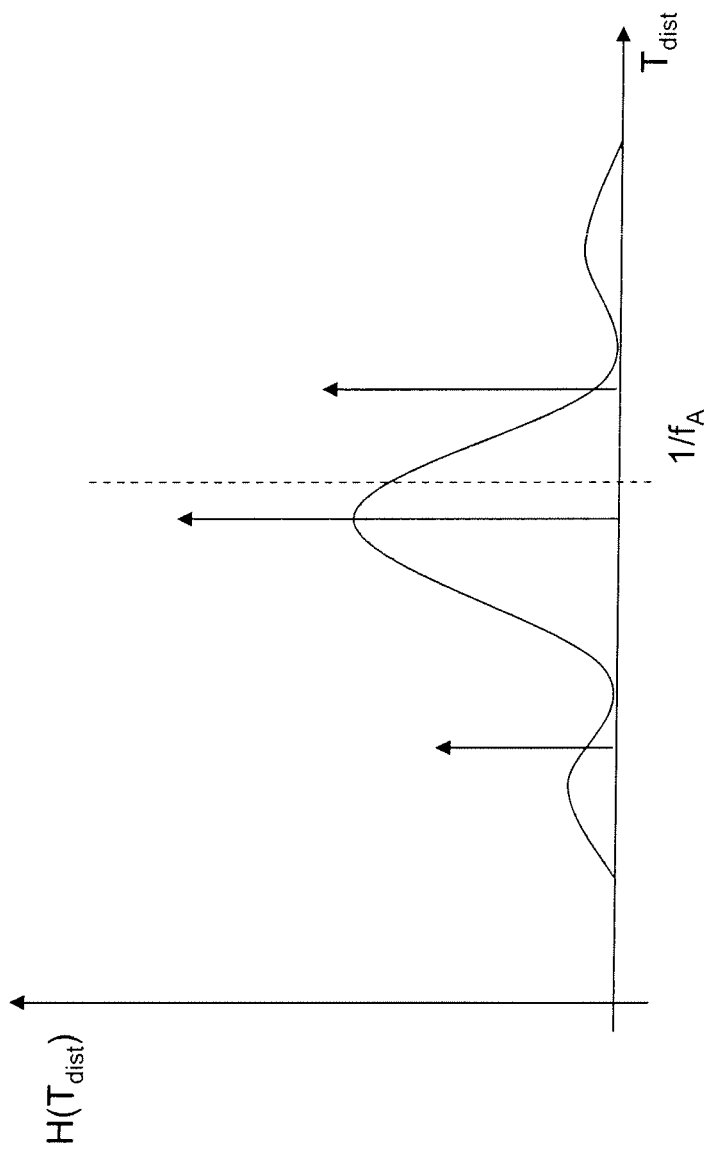
FIG. 3 illustrates an example of an embodiment having a density function, shown schematically, for time intervals between successive time-contiguous trigger signals of the sampler.

FIG. 3 illustrates an example of an embodiment having a density function $H(T_{dist})$ for time intervals between successive time-contiguous trigger signals of the sampler 36. Here, a mean sampling frequency $f_{SAMPLE}$ is defined as the inverse of a mean value of the time intervals $T_{dist}$ of successive time-contiguous trigger signals TS for opening the gate of the sampler 36 for the purpose of defining points in time for taking measurement values of the measurement signal SM.

Figure 4:
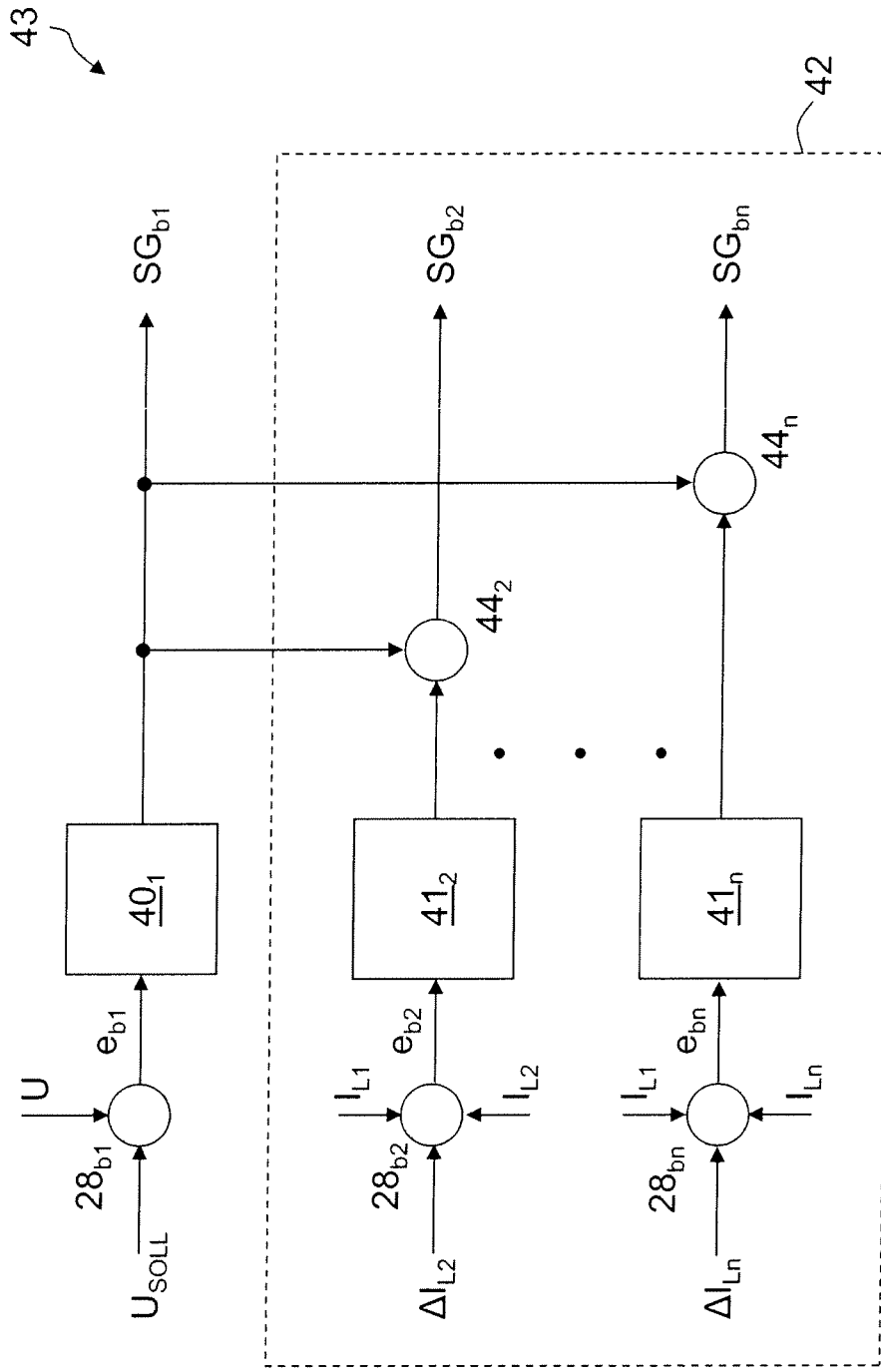
FIG. 4 illustrates a block diagram of an embodiment of a load current distributor.

FIG. 4 illustrates a schematic block diagram of an embodiment of a load-current distributor circuit 43, which generates such a second correcting variable $SG_b$ for each phase. Here, the output voltage U from the converter 14 is compared in a comparator $28_{b1}$ with a setpoint voltage $U_{SOLL}$, and the second correcting variable $SG_{b1}$ for the first phase is generated by means of a voltage regulator $40_1$.

For the second phase, the output current $I_{L1}$ of the first phase is first compared with the output current $I_{L2}$ of the second phase. The current difference $I_{L2}-I_{L1}$ is in turn compared with a current difference $\Delta I_{L2}$ defined as the reference value. A comparator $28_{b2}$ determines therefrom an error signal $e_{b2}=I_{L2}-I_{L1}-\Delta I_{L2}$, on the basis of which a second current regulator $41_2$ determines a first contribution to a second correcting variable $SG_{b2}$ of the second phase. The second correcting variable $SG_{b2}$ is formed by combining $44_2$ (preferably summating) the first contribution with the second correcting variable $SG_{b1}$ of the first phase.

Correspondingly for further phases i (where i is between 3 and n∈N), the output current $I_{L1}$ of the first phase is first compared with the output current $I_{Li}$ of the further phase i, and a further current regulator $41_i$ of the further phase i is used to generate from the current difference $I_{Li}$-$I_{L1}$ (equals the error signal $e_{bi}$) a first contribution to a second correcting variable $SG_{bi}$ of the further phase i. The second correcting variable $SG_{bi}$ of the further phase i is also formed by combining $44_i$ (preferably by summating) the first contribution with the second correcting variable $SG_{b1}$ of the first phase.

FIG. 5 illustrates a schematic flow diagram of an embodiment of a control method 100 for operating a converter 14. The control method 100 comprises the following steps 110, 120, 130, 140: generating 110 measurement signals SM on the basis of an electrical status $I_{L1}$ of an output line 35 by means of a sensor 34; generating 120 a sample signal $S_{SAMPLE}$ by sampling the received measurement signals SM by means of a sampler 36 at a sampling frequency $f_{SAMPLE}$; analyzing 130 the sample signal $S_{SAMPLE}$ and generating 140 a switching signal $SS_I$ at a switching frequency $f_{SW}$, wherein the switching frequency $f_{SW}$ is higher than the sampling frequency $f_{SAMPLE}$. The controller 18 for a converter 14 is designed to analyze the received measurement signals SM and to generate for the rising edge 38, measurement signals SM that are independent of measurement signals SM generated for the falling edge 39.

The concept in accordance with the invention can be applied to different types of converters, in particular also to DC-DC converters, inverters and/or frequency converters. The switching principles described can also be applied with the reverse polarity. Analog and/or digital electrical signals that are represented in the exemplary embodiments in the form of voltages can be represented alternatively or additionally as (impressed) currents. Amplifiers or converters can be used to modify the magnitude of voltages or currents mentioned in the description in the path from their respective sources to their respective sinks. Analog or digital signals that are represented in the form of voltages or currents can be linearly or non-linearly encoded in accordance with a known method or a method that is not yet known today. Examples of applicable coding methods are pulse width modulation and pulse code modulation. The analog and/or digital signals can be transmitted electrically, optically or by radio. The analog and/or digital signals can be transmitted in a space-division multiplex (i.e. using different lines), in a time-division multiplex or in a code-division multiplex. The analog and digital signals can be transmitted via one or more bus systems.

LIST OF REFERENCE SIGNS 10 circuit arrangement
12 electrical power source
14 converter
14a converter input
14b converter output
16 electrical load
18 converter controller
21 first terminal of the first switch $S_I$
22 second terminal of the first switch $S_I$
24 switching-signal generator
28 comparator
30 closed-loop controller
33 selector switch
34 measuring device; current sensor
35 output line
36 sampler
37 signal analyzer
38 rising edge
39 falling edge
40 voltage regulator
41 current regulator
42 load-current distributor
43 load-current distributor circuit
44 combiner
100 control method
110 receiving measurement signals
120 generating a sample signal by sampling received measurement signals
130 analyzing the sample signals
140 generating a switching signal
e error signal
B standby state
D conducting state
F flyback state
FG reference value
$f_{SAMPLE}$ sampling frequency
$f_{SW}$ switching frequency
$H(T_{dist})$ density function of the time intervals $T_{dist}$
$I_L$ output current
L inductance
P phase
PID Proportional-Integral-Differential
RG controlled variable
RS controlled system
$S_I$ switch
$S_{II}$ switch
SG correcting variable
SK circuit
SM measurement signal
$S_{SAMPLE}$ sample signal
$T_{dist}$ time interval between successive Line-contiguous trigger signals
TS trigger signal
$U_{SOLL}$ setpoint voltage

What is claimed is:

1. A controller for a converter, wherein the controller is designed to receive from a measuring device measurement signals on an output line of the converter, and to analyze the measurement signals in order to generate a switching signal that has a switching frequency, wherein the controller comprises a sampler for generating a sample signal by sampling received measurement signals, wherein the sample is designed to perform the sampling at a sampling frequency that is less than three times the switching frequency, wherein the sampler is designed to perform the sampling using successive trigger signals, and wherein a density function for time intervals between successive time-contiguous trigger signals comprises one or more Dirac delta functions and/or a continuous density function.

2. The controller as claimed in claim 1, wherein the sampler is designed to perform the sampling, for the switching frequency, at the sampling frequency, where neither the quotient of the sampling frequency divided by the switching frequency is a whole number nor the quotient of the switching frequency divided by the sampling frequency is a whole number.

3. The controller as claimed in claim 1, further comprising a switching-signal generator designed to generate the switching signal at the switching frequency that is greater than the sampling frequency at least by the factor n, where n equals 5/6, 21/20, 11/10, 6/5, 2, 4, 8, 16, 32, 64 or another power of two.

4. The controller as claimed in claim 1, wherein the controller is designed to determine from the sample signal at least one first type of statistical values.

5. The controller as claimed in claim 4, wherein the at least one first type of statistical values includes maximum values, minimum values, effective values, arithmetic mean values and/or median values.

6. The controller as claimed in claim 1, wherein the controller comprises at least one first comparator in order to compare a first setpoint value with a first actual value, which can be determined from the sample signal, and to determine from the result of the comparison a first correcting variable.

7. The controller as claimed in claim 6, wherein the controller comprises at least one second comparator in order to compare a second setpoint value with a second actual value, which can be determined from the sample signal, and to determine from the result of the comparison a second correcting variable.

8. The controller as claimed in claim 1, wherein the controller is designed to perform the analysis of the sample signals with regard to an output current, an output voltage and/or a spectral characteristic of one or more of these variables on the output line.

9. The controller as claimed in claim 1, wherein the controller is designed to control a minimum output current for a falling edge of an output current.

10. The controller as claimed in claim 8, wherein the controller is designed to control a peak current, an effective current, a mean current or another characteristic of the output current for a rising edge of the output current.

11. The controller as claimed in claim 1, wherein the controller is designed to receive measurement signals from at least two phase-specific output lines, to sample the received measurement signals, to generate the sample signals, and to generate the switching signals.

12. A converter, wherein the converter comprises at least one controller as claimed in claim 1.

13. The converter as claimed in claim 12, wherein the converter comprises a load-current distributor for distributing a load current to a plurality of phases.

14. A control method for operating a converter, wherein the control method comprises the following steps:
generating measurement signals on the basis of an electrical status of an output line;
generating a sample signal by sampling the received measurement signals at a sampling frequency;
analyzing the sample signals; and
generating a switching signal at a switching frequency, wherein the sampling frequency at which the sampling is performed is less than three times the switching frequency, and wherein the sampling is performed using successive trigger signals with a density function for time intervals between successive time-contiguous trigger signals comprising one or more Dirac delta functions and/or a continuous density function.

15. A converter having at least one controller designed to receive measurement signals from a measurement device on an output line of the converter and to analyze the measurement signals in order to generate a switching signal that has a switching frequency, wherein the at least one controller includes a sampler for generating a sampled signal by sampling received measurement signals and which is configured to perform the sampling at a sampling frequency that is less than three times the switching frequency, and wherein the sampler is configured to perform the sampling using successive trigger signals with a density function for time intervals between successive time-contiguous trigger signals comprising at least one of a Dirac delta function and a continuous density function.

16. The converter as claimed in claim 15 wherein the sampler is designed to perform the sampling, for the switching frequency, at the sampling frequency where neither the quotient of the sampling frequency divided by the switching frequency is a whole number nor the quotient of the switching frequency divided by the sampling frequency is a whole number.

17. The converter as claimed in claim 15 further comprising a switching-signal generator designed to generate the switching signal at the switching frequency that is greater than the sampling frequency at least by the factor n, where n equals 5/6, 21/20, 11/10, 6/5, 2, 4, 8, 16, 32, 64 or another power of two.

18. The converter as claimed in claim 15 wherein the controller is designed to perform the analysis of the sample signals with regard to an output current, an output voltage and/or a spectral characteristic of one or more of these variables on the output line.

19. The converter as claimed in claim 15 wherein the controller is designed to control a minimum output current for a falling edge of an output current.

20. The converter as claimed in claim 15 wherein the controller is designed to receive measurement signals from at least two phase-specific output lines, to sample the received measurement signals, to generate the sample signals, and to generate the switching signals.

* * * * *